United States Patent [19]
Kataoka et al.

[11] Patent Number: 5,637,382
[45] Date of Patent: Jun. 10, 1997

[54] FLEXIBLE COPPER-COATED LAMINATE AND FLEXIBLE PRINTED CIRCUIT BOARD

[75] Inventors: Kosuke Kataoka; Eiichiro Kuribayashi; Yoshihide Ohnari, all of Otsu, Japan

[73] Assignee: Kanegafuchi Kagaku Kogyo Kabushiki Kaisha, Osaka, Japan

[21] Appl. No.: 592,480

[22] Filed: Jan. 26, 1996

[51] Int. Cl.$^6$ ............................................. B32B 9/00
[52] U.S. Cl. ................... 428/209; 428/473.5; 428/901; 361/748; 361/749; 361/750; 174/256
[58] Field of Search ..................... 428/209, 473.5, 428/901; 361/748, 749, 750; 174/256

[56] References Cited

U.S. PATENT DOCUMENTS

| | | | |
|---|---|---|---|
| 3,499,220 | 3/1970 | Hintz et al. | 29/626 |
| 3,764,422 | 10/1973 | Koritke et al. | 156/3 |
| 3,766,439 | 10/1973 | Isaacson | 317/100 |
| 4,517,051 | 5/1985 | Gazdik et al. | 156/644 |
| 5,112,462 | 5/1992 | Swisher | 205/165 |
| 5,137,791 | 8/1992 | Swisher | 428/612 |
| 5,218,034 | 6/1993 | Milligan et al. | 524/399 |

OTHER PUBLICATIONS

Flexible Circuits Offer a Simple Solution to Chip–Carrier Mounting by Peter Kirby; Electronics Feb. 1984.

*Primary Examiner*—Patrick Ryan
*Assistant Examiner*—Cathy Lam
*Attorney, Agent, or Firm*—Armstrong, Westerman, Hattori, McLeland & Naughton

[57] ABSTRACT

The object of the invention is to embody further thinning of a double layer flexible printed circuit board (FPC) and provide a flexible copper-coated laminate capable of producing such a novel flexible printed circuit board distinguished in bending characteristic and heat-resistant property and provide a printed circuit board using the novel flexible copper-coated laminate. To achieve the above object, novel flexible copper-coated laminates 10 and 12 according to the present invention are respectively composed by directly forming a copper layer 16 having a thickness of 10 μm or less than 10 μm on a single surface or both surfaces of polyimide film 14 which is composed of polyimide polymer containing modulus of initial tensile elasticity of 400 kg/mm$^2$ or more than 400 kg/mm$^2$, and which has a thickness of 10 μm or less than 10 μm.

2 Claims, 1 Drawing Sheet

# FLEXIBLE COPPER-COATED LAMINATE AND FLEXIBLE PRINTED CIRCUIT BOARD

BACKGROUND OF THE INVENTION

The present invention relates to a novel flexible copper-coated laminate and a flexible printed circuit board. More particularly, the invention relates to a flexible printed circuit board which has distinguished bending characteristic, and a novel flexible copper-coated laminate which can produce the flexible printed circuit board.

Conventionally, taking advantage of own flexibility, flexible printed circuit boards (hereinafter merely referred to as FPCs) have mainly been used in narrow space inside of cameras in folded form. However, recently, in addition to conventional cameras, FPCs have also been used to compose slidable portion for linking drive-reading head with head-controlling unit of electronic apparatuses such as floppy-disc drive (FDD) and hard-disc drive (HDD) for example. Development to achieve further down-sizing and power-saving of electronic apparatuses has been underway, and thus more substantial bending characteristic is required for FPCs. To achieve higher bending characteristic, further thinning of FPCs has been studied by way of thinning component material layers.

As an example of conventional FPCs, a triple-layer FPC comprising the laminate of a polyimide film layer, an adhesive-agent layer, and a copper layer is indicated. Typically, as shown in FIG. 3, such a triple-layer FPC is manufactured by a process of manufacturing triple-layer flexible copper-coated laminate 4 by adhering polyimide film 1 to copper foil 2 via adhesive-agent layer 3, followed by a process of forming circuits by etching copper layer (2) secured to the copper-coated laminate 4.

However, since the adhesive-agent layer 3 is present in the triple-layer FPC (4), there is a limit in the thinning. In addition, since the adhesive-agent layer 3 uses adhesive agent 3 exerting less heat-resistant property, electrical characteristic, and mechanical strength than those of the polyimide film 1, thus there has been such a problem as proper characteristic of the polyimide film cannot fully be exerted. To solve the above defective property of triple-layer FPCs, such a double-layer FPC comprising polyimide a film layer and a copper layer for example without presence of an adhesive-agent layer has drawn attention of the concerned. Actually, development of the double-layer FPC has already been underway. Since no adhesive-agent layer is present, the double-layer FPC can substantially exert proper characteristic of polyimide film, and yet, laminate can be thinned further than the above-cited triple-layer FPC to permit the double-layer FPC to improve heat-resistant property and bending characteristic.

The double-layer FPC can be manufactured by initially forming a flexible copper-coated laminate comprising double layers consisting of a polyimide film layer and a copper layer, followed by a process to form a circuit by way of etching the copper layer thereof. The double layer flexible copper-coated laminate can be manufactured by applying any of those methods including the following; cast method which initially coats a single surface or both surfaces of copper foil with varnish of polyamide acid being a precursor of polyimide, followed by a process to imidize the varnished surface by applying heat treatment; chemical vapor deposition method which thermally vaporizes copper component in high vacuum condition followed by a process to cause vaporized copper component to be adhered onto polyimide film surface as thin film; or non-electrolytic plating method which initially causes copper to be precipitated on a polyimide film surface by generating chemical reduction reaction in plating solution before eventually forming a copper layer thereon.

Nevertheless, because of handling inconvenience of material such as polyimide film or copper foil, there has been the following problem in the course of manufacturing the double-layer copper-coated laminate, and as a result, it was impracticable to diminish thickness of respective materials to 10 µm or less than 10 µm.

Concretely, when manufacturing a double-layer flexible copper-coated laminate via the above-cited cast method, because of the need to coat a single surface of copper foil with varnish of polyamide acid, handling property of copper foil must securely be maintained, and thus the thickness of copper foil could not be reduced to 10 µm or less than 10 µm. On the other hand, when manufacturing a double-layer flexible copper-coated laminate via the above-cited chemical vapor deposition method or non-electrolytic plating method, since the surface of polyimide film is treated with chemical vapor deposition process or plating process, handling property of polyimide film must also be maintained, and as a result, there has been such a problem that the thickness of polyimide film cannot be diminished to 12.5 µm or less than 12.5 µm.

Because of the above reasons, it was impracticable to manufacture such a double-layer FPC having a thickness of 10 µm or less than 10 µm of polyimide film and copper layer, thus resulting in the difficulty to materialize thinner layers of FPCs.

In order to fully solve the above problems by way of realizing thinner layers of double-layer FPCs and provide a flexible copper-coated laminate capable of manufacturing such FPCs distinguished in bending characteristic and heat-resistant property, inventors have strenuously followed up studies and discovered that such a film composed of polyimide polymer having modulus of initial tensile elasticity of 400 kg/mm² or more than 400 kg/mm² can exert sufficient handling property even when the thickness of the film is 10 µm or less than 10 µm, and eventually consummated the invention.

BRIEF SUMMARY

The subject of a novel flexible copper-coated laminate according to the present invention is in direct formation of a copper layer having a thickness of 10 µm or less than 10 µm on a single surface or both surfaces of polyimide film having a thickness of 10 µm or less than 10 µm and comprising polyimide polymer containing modulus of initial tensile elasticity of 400 kg/mm² or more than 400 kg/mm².

The subject of a flexible printed circuit board according to the present invention is in that the flexible printed circuit board is formed by novel flexible copper-coated laminate which is formed by direct formation of a copper layer having a thickness of 10 µm or less than 10 µm on a single surface or both surfaces of polyimide film having a thickness of 10 µm or less than 10 µm and comprising polyimide polymer containing modulus of initial tensile elasticity of 400 kg/mm² or more than 400 kg/mm².

A novel flexible copper-coated laminate related to the present invention is characterized in that direct formation of a copper layer having a thickness of 10 µm or less than 10 µm on a single surface or both surfaces of polyimide film having a thickness of 10 µm or less than 10 µm and comprising polyimide polymer containing modulus of initial tensile elasticity of 400 kg/mm² or more than 400 kg/mm², wherein said film comprising polyimide polymer containing modulus of initial tensile elasticity of 400 kg/mm$^2$ or more than 400 kg/mm$^2$ has sufficient handling property even when given thickness is 10 µm or less than 10 µm. Accordingly, it is practicable to effect chemical vapor deposition process or plating process on a single surface or both surfaces of polyimide film having a thickness of 10 µm or less than 10 µm, and such a copper layer having a thickness of 10 µm or less than 10 µm can directly be formed thereon.

As a result, it is possible to manufacture a double-layer flexible copper-coated laminate comprising a polyimide-film layer and a copper layer respectively having a thickness of 10 µm or less than 10 µm. Since no adhesive-agent layer is present, it is possible to materialize thinner thickness of the double-layer FPC by virtue of using the inventive flexible copper-coated laminate, and yet, by virtue of using the inventive flexible copper-coated laminate, such a flexible printed circuit board distinguished in bending property and heat-resistant property can securely be materialized.

DETAILED DESCRIPTION OF THE INVENTION

The following is an explanation of examples of novel flexible copper-coated laminate according to the present invention.

Figure 1:
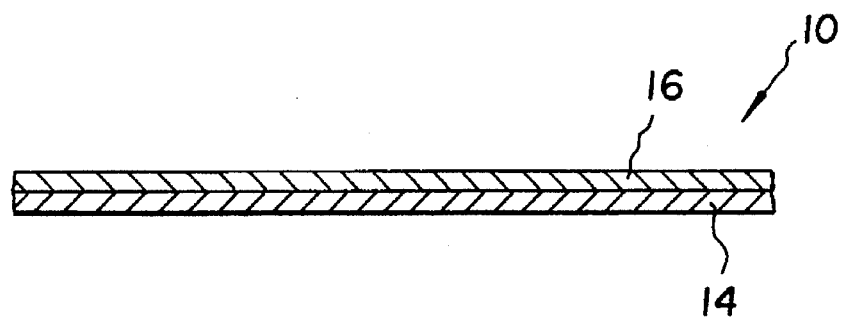
FIG. 1 and FIG. 2 are respectively enlarged sectional views of essential components showing an example of the novel flexible copper-coated laminates related to the invention.
Figure 2:
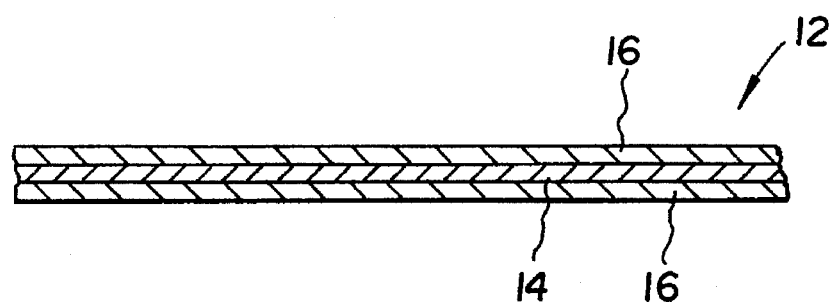
Figure 3:
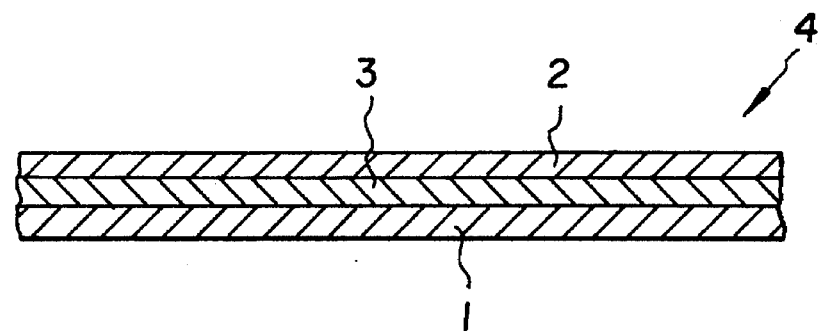
FIG. 3 is an enlarged sectional view of essential components showing an example of conventional flexible copper-coated laminates.

As is shown in FIG. 1 and FIG. 2, novel copper-coated flexible laminates 10 and 12 according to the invention respectively comprise a copper layer 16 having a thickness of 10 µm or less than 10 µm, which is directly formed on a single surface or both surfaces of a polyimide film 14 having a thickness of 10 µm or less than 10 µm. The polyimide film 14 which is used for embodying the present invention comprises polyimide polymer having modulus of initial tensile elasticity of 400 kg/mm$^2$ or more than 400 kg/mm$^2$.

Manufacturing method of the polyimide film is that at first solution of polyamide acid polymer which is a precursor of said polyimide polymer is prepared. The polyamide acid polymer solution can be obtained according to conventional well known process by throughly stirring and polymerizing in organic solvent two components: aromatic diamine component represented by 4,4'-diaminodiphenyl ether and aromatic tetracarboxylic acid dianhydride component represented by pyromellitic acid dianhydride. The aromatic diamine component and the aromatic tetracarboxylic acid dianhydride component can be respectively used either solely or by the mixture of two or more kinds, to be gradually added to the extent that mole of all acid dianhydride components and mole of all diamine components are substantively equal.

Diamino diphenyl ether, paraphenylene diamine, bis(3-aminophenoxy-phenyl)propane, etc. can be concretely indicated for aromatic diamine components, and other various aromatic diamines can be used. These aromatic diamine components can be used either solely or by the mixture of two or more kinds.

Pyromellitic acid dianhydride, biphenyl tetracarboxylic acid dianhydride, etc. can be indicated for aromatic tetracarboxylic acid dianhydride component, and other various aromatic tetracarboxylic acid dianhydride can be used. These aromatic tetracarboxylic acid dianhydride components can be used either solely or by the mixture of two or more kinds.

As examples of organic solvent, sulfoxide solvents such as dimethyl sulfoxide, diethyl sulfoxide; formamide solvents as N,N-dimethyl formamide, N,N-diethyl formamide; acetoamide solvents as N,N-dimethyl acetamide, N,N-diethyl acetamide can be indicated. These can be used either solely or as the mixed solvent of two or three or more kinds. Further, these polar solvents can be used as mixed solvents with non-polar solvents of polyamide acid copolymer such as acetone, methanol, ethanol, isopropanol, benzene methyl cellosolve.

Next, polyamide-acid polymer solution formulated via the above-referred method is formed into a film, which is then thermally and/or chemically dehydrated so that linkage can be closed. In consequence, polyimide film having a thickness of 10 µm or less than 10 µm available for embodying the invention can be obtained. The polyimide film comprising polyimide polymer having modulus of initial tensile elasticity of 400 kg/mm$^2$ or more than 400 kg/mm$^2$ maintains handling property in the course of forming a copper layer even when the film thickness is formed 10 µm or less than 10 µm, and accordingly, the above polyimide film can ideally be used for embodying the invention.

Next, the above-referred flexible copper-coated laminates 10 and 12 related to the invention are manufactured by directly forming a copper layer 16 having a thickness of 10 µm or less than 10 µm on a single surface or both surfaces of a polyimide film 14 having a thickness of 10 µm or less than 10 µm and comprising polyimide polymer having modulus of initial tensile elasticity of 400 kg/mm$^2$ or more than 400 kg/mm$^2$ via chemical vapor deposition process or non-electrolytic plating process. As was described above, since the polyimide film 14 has sufficient handling property even when given thickness is merely 10 µm or less than 10 µm, said copper layer 16 can directly be formed on the film surface via chemical vapor deposition process or non-electrolytic plating process, and yet, by virtue of using the polyimide film comprising polyimide polymer having modulus of initial tensile elasticity 400 kg/mm$^2$ or more than 400 kg/mm$^2$, the inventive flexible copper-coated laminates 10 and 12 respectively featuring thicknesses of 10 µm or less than 10 µm of polyimide film layer and copper layer can securely be manufactured.

No adhesive-agent layer is present in the novel flexible copper-coated laminates 10 and 12 produced via the above-described processes. The polyimide film layer and the copper layer are respectively fabricated in a thickness of 10 µm or less than 10 µm. By virtue of using the novel flexible copper-coated laminate, it is possible to further thin the thickness of double-layer FPC. That is, the invention can provide such a FPC featuring more distinguished bending characteristic than any of conventional FPCs.

Various examples of the novel flexible copper-coated laminate according to the invention have thus been described above. It should be understood however that the scope of the invention is by no means confined to those examples thus far described, but insofar as the above-referred polyimide film is substantially thermoplastic polyimide film containing adhesive property, it is also possible to directly form a copper layer on a single surface or both surfaces of the polyimide film by laminating the polyimide film and copper foil. In addition, it is also possible to manufacture multi-layer FPCs by way of laminating the above-described FPCs without interposing adhesive agent therebetween.

It should be understood however that the scope of the invention is not solely limited to the above examples, but the invention can also be implemented by way of adding a variety of improvements, alterations, and modifications based on the knowledges of those skilled in the art without departing from the fundamental scope thereof. The invention is further described by way of examples. It should be understood however that the scope of the invention is by no means limited to the following examples.

EXAMPLE 1

Initially, using "Apical" NPI (a product and a registered trade name of Kanegafuchi Chemical Industry Co., Ltd.) comprising polyimide polymer having modulus of initial tensile elasticity of 420 kg/mm$^2$, a polyimide film having a thickness of 7.5 μm was produced. Next, copper layers each having a thickness of 5 μm or 10 μm were directly formed on single surfaces of the produced polyimide films via chemical vapor deposition process. The produced polyimide film maintained sufficient handling property, thereby it was possible to yield two kinds of copper-coated laminates each having a copper layer of 5 μm or 10 μm thickness formed thereon via chemical vapor deposition process. Next, copper layers formed on the copper-coated laminates were etched to form circuit patterns. Next, another polyimide film having a thickness of 7.5 μm and composition identical to the above film was applied with a phenolic adhesive agent to effect covering, thus completing two kinds of flexible printed circuit boards. It was arranged that 50% of copper component could remain effective after formation of circuit patterns.

To evaluate bending characteristic of the completed FPCs, loop stiffness (on the basis of gram) and bend-resistant property against one million rounds of bending respectively being index to determine bending characteristic were measured. In the course of measuring loop stiffness using a loop-stiffness tester (a product of Toyo Precision Instruments Co., Ltd.), load needed for preserving specific deformation (crushing distance) given to looped portion of tested object was measured based on test condition of 50 m loop length, 15 mm crush distance, and 15 mm sample width. In the course of checking bend-resistant property, bent rounds were counted until reaching check-completing point predetermined at a point at which resistance value exactly reached 1800 mΩ under test condition based on IPC-243B with 1500 rounds/min. bending speed, 25 mm stroke, 5 mm bending rate, and 1 mA impressed current. Test results are shown in Table 1.

TABLE 1

|  | EXAMPLE 1 | | COMPARATIVE EXAMPLE 1 | |
| --- | --- | --- | --- | --- |
| Thickness of film (μm) | 7.5 | | 12.5 | |
| Thickness of copper layer (μm) | 5 | 10 | 5 | 10 |
| Loop stiffness (g) | 0.5 | 0.7 | 1.4 | 1.9 |
| Bend resistant property (one million rounds) | 300 | 250 | 190 | 160 |

COMPARATIVE EXAMPLE 1

Initially, using "Apical" NPI (a product and a registered trade name of Kanegafuchi Chemical Industry Co., Ltd.) comprising polyimide polymer having modulus of initial tensile elasticity of 420 kg/mm$^2$, a polyimide film of 12.5 μm thickness was produced. Next, copper layers each having a thickness of 5 μm or 10 μm were formed on single surfaces of the produced polyimide films and then produced two kinds of copper-coated laminates. Next, in the same way as was done for the Example 1, two kinds of copper-coated laminates were produced. Finally, in the same way as was done for the Example 1, bending characteristic of the produced FPCs was evaluated. Test results are also shown in Table 1.

EXAMPLE 2

Initially, using "Apical" NPI (a product and a registered trade name of Kanegafuchi Chemical Industry Co., Ltd.), a polyimide film of 7.5 μm thickness was produced. Next, copper layers each having a thickness of 5 μm or 10 μm were directly formed on single surfaces of the produced polyimide films via non-electrolytic plating process. The processed films had sufficient handling property, thereby it was possible to produce two kinds of copper-coated laminates each having a copper layer of 5 μm or 10 μm thickness formed thereon via non-electrolytic plating process. Next, in the same way as was done for the Example 1, two kinds of copper-coated laminates were produced. Next, as was done for the Example 1, bending property of the produced FPCs was evaluated. Test results are also shown in Table 2.

TABLE 2

|  | EXAMPLE 2 | | COMPARATIVE EXAMPLE 2 | |
| --- | --- | --- | --- | --- |
| Thickness of film (μm) | 7.5 | | 12.5 | |
| Thickness of copper layer (μm) | 5 | 10 | 5 | 10 |
| Loop stiffness (g) | 0.6 | 0.8 | 1.5 | 2.1 |
| Bend resistant property (one million rounds) | 290 | 230 | 170 | 140 |

COMPARATIVE EXAMPLE 2

Initially, using "Apical" NPI (a product and a registered trade name of Kanegafuchi Chemical Industry Co., Ltd.), a polyimide film of 12.5 μm thickness was produced. Next, copper layers each having a thickness of 5 μm or 10 μm were formed on single surfaces of the produced polyimide film via non-electrolytic plating process to complete two kinds of copper-coated laminates. Next, in the same way as was done for the Example 1, two kinds of flexible printed circuit boards were produced. Finally, as was done for the Example 1, bending property of the produced FPCs was evaluated. Test results are also shown in Table 2.

COMPARATIVE EXAMPLE 3

Initially, using "Apical" NPI (a product and a registered trade name of Kanegafuchi Chemical Industry Co., Ltd.), a polyimide film of 7.5 μm thickness was produced. Next, a copper layer of 5 μm thickness was formed on a single surface of the produced polyimide film via non-electrolytic plating process. Then, another copper layer was further formed thereon via electrolytic plating process, and finally a copper coated laminate having 18 μm total thickness of copper layer was produced. Next, in the same way as was done for the Example 1, a flexible printed circuit board was produced. Finally, as was done for the Example 1, bending property of the produced FPC was checked for evaluation. Test results are shown in Table 3.

TABLE 3

|  | COMPARATIVE EXAMPLE 3 |
|---|---|
| Thickness of film (μm) | 7.5 |
| Thickness of copper layer (μm) | 18 |
| Loop stiffness (g) | 4.5 |
| Bend resistant property (one million rounds) | 100 |

It is understood from Table 1 through 3 that the inventive art can securely produce such flexible printed circuit boards distinctly satisfactory in bending characteristic by way of forming a film comprising polyimide polymer containing modulus of initial tensile elasticity of 400 kg/mm² or more than 400 kg/mm² followed by formation of a copper layer having a thickness of 10 μm or less than 10 μm via chemical vapor deposition process or non-electrolytic plating process. It is also understood that the thinner the thickness of a copper layer is formed, the more bending characteristic is distinguished. Further, it is also understood that even when a film thickness is 10 μm or less than 10 μm, when forming a copper layer of 10 μm or more than 10 μm thickness, bending characteristic of the flexible printed circuit boards turns to be degraded.

What is claimed is:

1. A flexible copper-coated laminate comprising a copper layer having a thickness of 10 μm or less than 10 μm, which is directly formed on a single surface or both surfaces of a polyimide film having a thickness of 10 μm or less than 10 μm and comprising polyimide polymer having modulus of initial tensile elasticity of 400 kg/mm² or more than 400 kg/mm².

2. A flexible printed circuit board comprising the flexible copper-coated laminate described in said claim 1.

* * * * *